United States Patent
In Gyun (10) Patent No.: US 7,214,560 B2
(45) Date of Patent: May 8, 2007

(54) CMOS IMAGE SENSOR AND METHOD FOR FABRICATING THE SAME

(75) Inventor: Jeon In Gyun, Gyeonggi-do (KR)

(73) Assignee: Dongbu Electronics Co., Ltd., Seoul (KR)

( * ) Notice: Subject to any disclaimer, the term of this patent is extended or adjusted under 35 U.S.C. 154(b) by 50 days.

(21) Appl. No.: 11/001,311

(22) Filed: Dec. 2, 2004

(65) Prior Publication Data

US 2005/0145901 A1 Jul. 7, 2005

(30) Foreign Application Priority Data

Dec. 31, 2003 (KR) ............... 10-2003-0101544

(51) Int. Cl.
*H01L 29/72* (2006.01)
(52) U.S. Cl. .............. 438/57; 438/70; 438/197; 438/287; 438/591; 257/290; 250/208.1
(58) Field of Classification Search ........ 257/290; 438/467, 57, 70, 197, 287, 591; 250/208.1
See application file for complete search history.

(56) References Cited

U.S. PATENT DOCUMENTS

| | | | | |
|---|---|---|---|---|
| 5,744,823 A | * | 4/1998 | Harkin et al. | 257/68 |
| 6,452,212 B1 | * | 9/2002 | Codama et al. | 257/66 |
| 6,580,145 B2 | * | 6/2003 | Wu et al. | 257/530 |

* cited by examiner

*Primary Examiner*—Edward Wojciechowicz
(74) *Attorney, Agent, or Firm*—Finnegan, Henderson, Farabow, Garrett, & Dunner, L.L.P.

(57) ABSTRACT

A CMOS image sensor and a method for fabricating the same is disclosed, to improve reliability of a driving part transistor and to improve an output voltage of a photodiode, which includes a semiconductor substrate defined as a photodiode transistor region and a driving part transistor region; a first gate insulating layer on the photodiode transistor region of the semiconductor substrate; a second gate insulating layer on the driving part transistor region of the semiconductor substrate, wherein the second gate insulating layer is thicker than the first gate insulating layer; and gate electrodes on the respective first and second gate insulating layers.

6 Claims, 6 Drawing Sheets

CMOS IMAGE SENSOR AND METHOD FOR FABRICATING THE SAME

This application claims the benefit of the Korean Application No. P2003-101544 filed on Dec. 31, 2003, which is hereby incorporated by reference.

BACKGROUND OF THE INVENTION

1. Field of the Invention

The present invention relates to a CMOS image sensor and a method for fabricating the same, and more particularly, to a CMOS image sensor and a method for fabricating the same, to improve reliability of a transistor for a driving part, and to improve a voltage of a photodiode.

2. Discussion of the Related Art

Generally, an image sensor is a semiconductor device for converting an optical image into an electric signal. The image sensor can be broadly categorized into a charge coupled device (CCD) and a complementary metal oxide semiconductor (CMOS) image sensor.

The charge coupled device (CCD) includes a plurality of photodiodes (PD) aligned in a matrix-type configuration and converting light signals into electric signals, a plurality of vertical charge coupled devices (VCCD) formed between each vertical photodiode aligned in a matrix-type configuration and vertically transmitting electric charges generated from each photodiode, a horizontal charge coupled device (HCCD) horizontally transmitting the electric charges transmitted by each of the vertical charge coupled devices (VCCD), and a sense amplifier sensing and outputting the horizontally transmitted electric charges.

However, the charge coupled device (CCD) has disadvantages of a complicated driving method, high power consumption, and a complicated fabrication process requiring a multi-phased photo process. In the charge coupled device (CCD), a control circuit, a signal processing circuit, an analog to digital (A/D) converter circuit, and so on cannot be easily integrated into a charge coupled device chip, thereby having the problem of forming compact-size products.

Recently, the complementary metal oxide semiconductor (CMOS) image sensor has been considered to be the next generation image sensor that can resolve the problems and disadvantages of the charge coupled device (CCD). The CMOS image sensor is a device adopting a CMOS technology using the control circuit, the signal processing circuit, and so on as a peripheral circuit, so as to form MOS transistors corresponding to the number of unit pixels on a semiconductor substrate, in order to sequentially detect the electric signals of each unit pixel by using a switching method, thereby representing an image.

Since the CMOS image sensor uses a CMOS fabrication technology, the CMOS image sensor is advantageous in that it has low power consumption and has a simple fabrication method through less photo process steps. In the CMOS image sensor, a control circuit, a signal processing circuit, an A/D converter circuit, and so on can be integrated in a CMOS image sensor chip, thereby enabling the product to be fabricated in a compact size. Accordingly, the CMOS image sensor is currently being extensively used in various applied technologies, such as digital still cameras and digital video cameras.

Meanwhile, the CMOS image sensor is categorized into 3T-type, 4T-type, and 5T-type according to the number of transistors, wherein the 3T-type CMOS image sensor is comprised of one photodiode and three transistors, and the 4T-type CMOS image sensor is comprised of one photodiode and four transistors. A layout of a unit pixel in the 3T-type and 4T-type CMOS image sensors will be described as follows.

Figure 1:
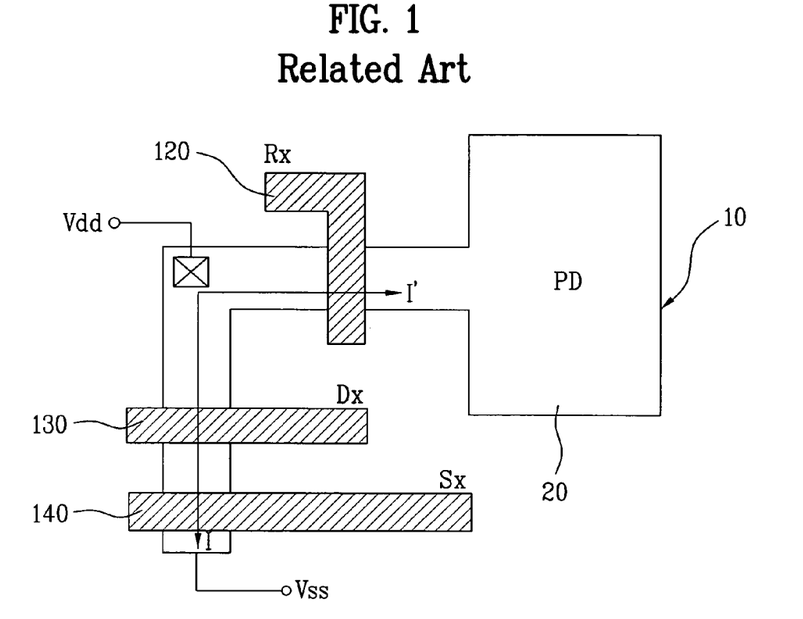
FIG. 1 is a layout of a unit pixel in a 3T-type CMOS image sensor.
Figure 2:
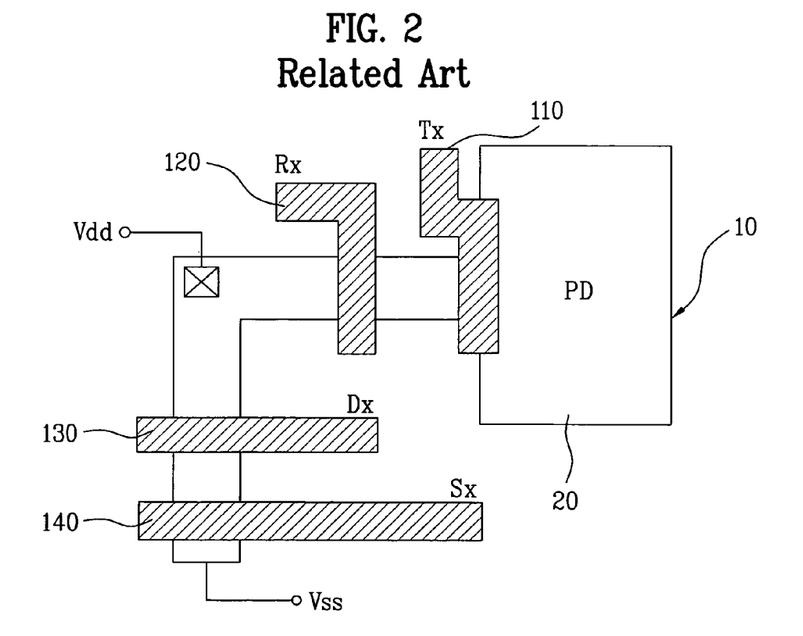
FIG. 2 is a layout of a unit pixel in a 4T-type CMOS image sensor.
Figure 3:
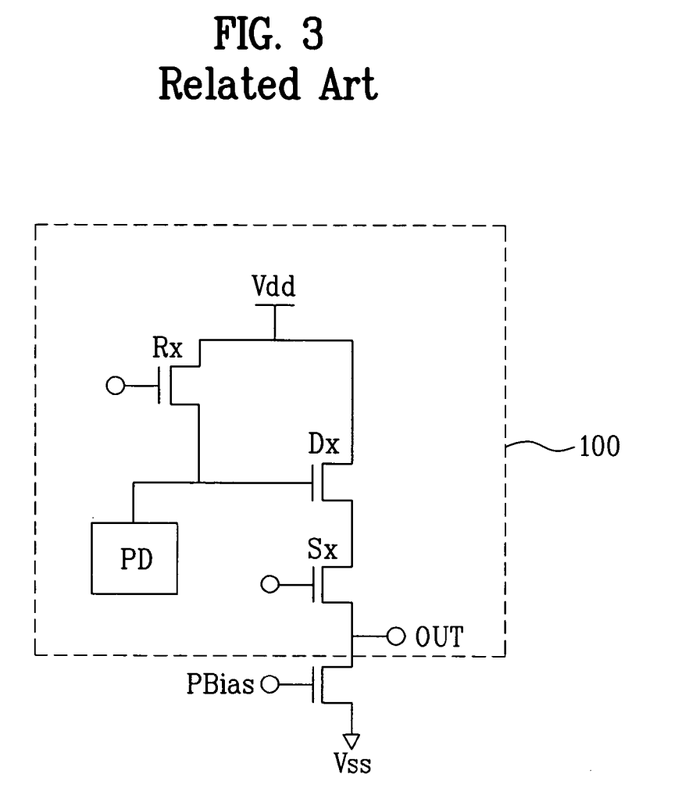
FIG. 3 is a circuit diagram of a unit pixel in a 3T-type image sensor.
Figure 4:
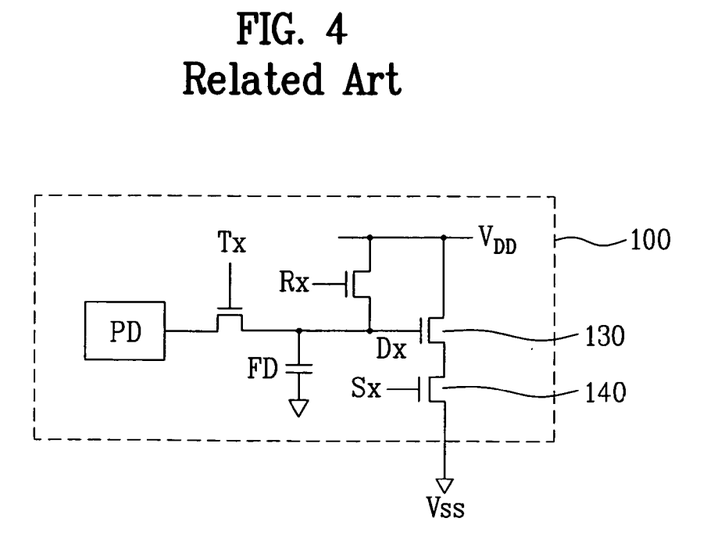
FIG. 4 is a circuit diagram of a unit pixel in a 4T-type image sensor.

FIG. 1 is a layout of a unit pixel in a 3T-type CMOS image sensor. FIG. 2 is a layout of a unit pixel in a 4T-type CMOS image sensor. FIG. 3 is an equivalent circuit diagram of a unit pixel in a general 3T-type image sensor. FIG. 4 is an equivalent circuit diagram of a unit pixel in a general 4T-type image sensor.

In a unit pixel of a general 3T-type image sensor, as shown in FIG. 1, an active area 10 is defined. Then, one photodiode 20 is formed in a large sized portion of the active area 10, and respective gate electrodes 120, 130, and 140 of three transistors are overlapped with the remaining portion of the active area 10. That is, a reset transistor Rx is formed by the gate electrode 120, a drive transistor Dx is formed by the gate electrode 130, and a select transistor Sx is formed by the gate electrode 140. In this case, impurity ions are implanted to the active area 10 of the respective transistors except portions below the gate electrodes 120, 130, and 140, thereby forming source/drain regions in the respective transistors. Accordingly, a power voltage Vdd is applied to the source/drain regions between the reset transistor Rx and the drive transistor Dx, and a power voltage Vss is applied to the source/drain regions at one side of the select transistor Sx.

Also, as shown in FIG. 2, in a unit pixel of a general 4T-type image sensor, an active area 10 is defined. Then, one photodiode 20 is formed in a large sized portion of the active area 10, and respective gate electrodes 110, 120, 130, and 140 of four transistors are overlapped with the remaining portion of the active area 10. That is, a transfer transistor Tx is formed by the gate electrode 110, a reset transistor Rx is formed by the gate electrode 120, a drive transistor Dx is formed by the gate electrode 130, and a select transistor Sx is formed by the gate electrode 140. At this time, impurity ions are implanted to the active area 10 of the respective transistors except portions below the gate electrodes 110, 120, 130, and 140, thereby forming source/drain regions in the respective transistors. Accordingly, a power voltage Vdd is applied to the source/drain regions between the reset transistor Rx and the drive transistor Dx, and a power voltage Vss is applied to the source/drain regions at one side of the select transistor Sx.

That is, as shown in FIG. 1 to FIG. 4, in case of both 3T-type and 4T-type image sensors, a contact region is formed in the active area between the reset transistor Rx and the drive transistor Dx, whereby the power voltage Vdd is applied to the photodiode, and the power voltage Vss is applied to the select transistor Sx.

Also, the transistors comprising of the 3T-type and 4T-type image sensors are divided into a photodiode transistor and a driving part transistor according to their functional characteristics. In this state, the photodiode transistor functions as a switching transistor for inputting/outputting data to/from the photodiode. For example, in case of the 3T-type image sensor, the reset transistor is corresponding to the photodiode transistor of the switching transistor. In case of the 4T-type image sensor, the reset transistor and the transfer transistor are corresponding to the photodiode transistor of the switching transistor. Also, the driving part transistor functions as a transistor for outputting data (optical electric charge) outputted from the photodiode through a column line to the external. For example, in case of the 3T-type and 4T-type image sensors, the drive transistor and the select transistor function as the driving part transistor. When dividing the photodiode transistor and the driving part transistor in the unit pixel, the photodiode transistor is positioned between the photodiode and the power voltage Vdd, and the driving part transistor is positioned between the power voltage Vdd and Vss.

A photodiode transistor and a driving part transistor of a related art CMOS image sensor will be described as follows.

Figure 5:
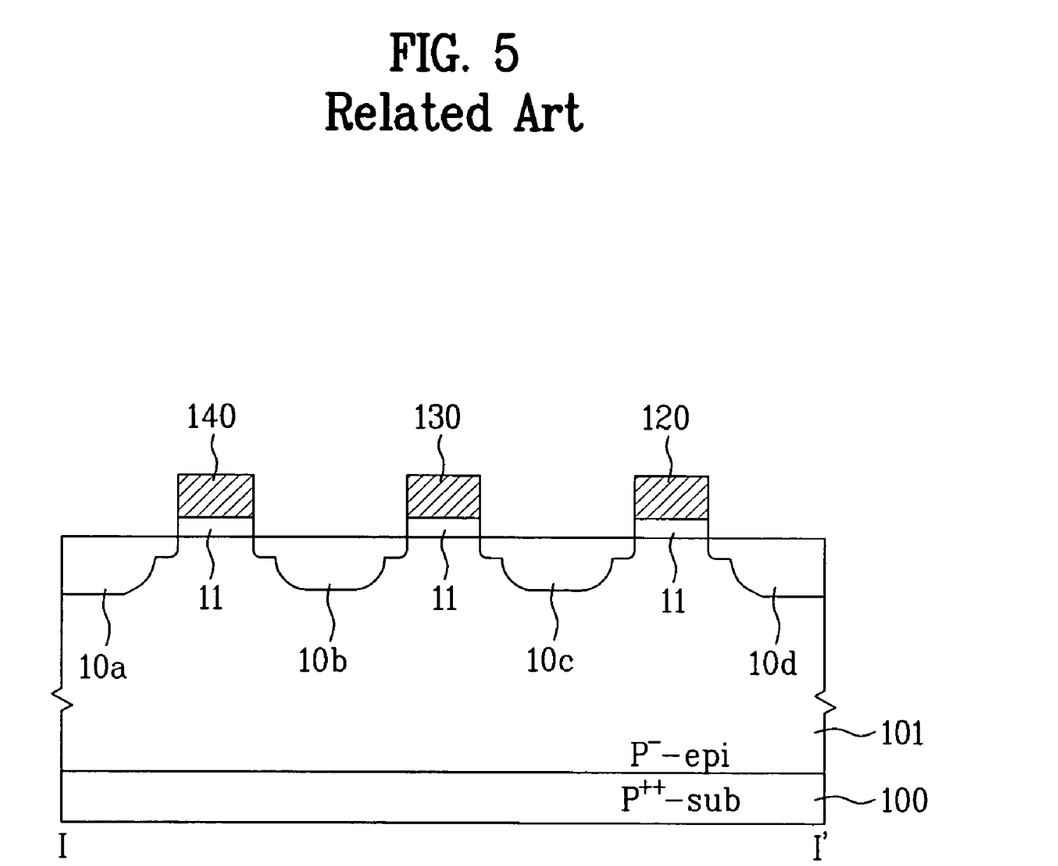
FIG. 5 is a cross sectional view of a related art CMOS image sensor along I–I' of FIG. 1.

FIG. 5 is a cross sectional view of the related art CMOS image sensor along I–I' of FIG. 5. As shown in FIG. 5, a p-type epitaxial layer 101 is formed on a p-type semiconductor substrate 100, to form a large and deep depletion region in a photodiode of the p-type semiconductor substrate 100. Then, after defining an active area ('10' of FIG. 1 or FIG. 2), a gate insulating layer 11 and respective gate electrodes 120, 130, and 140 of a reset transistor Rx, a drive transistor Dx, and a select transistor Sx are formed on the p-type epitaxial layer 101. At this time, the gate insulating layer 11 corresponding to the respective gate electrodes 120, 130, and 140 of the reset transistor Rx, the drive transistor Dx, and the select transistor Sx has the same thickness. After that, source/drain regions 10a, 10b, 10c, and 10d are formed in the active area ('10' of FIG. 1 or FIG. 2) between each gate electrode 120, 130, and 140.

An operation of the related art CMOS image sensor will be described as follows.

First, the power voltage Vdd is applied to the photodiode 20 through the photodiode transistor (reset transistor or transfer transistor). After a predetermined time period, the optical electric charge generated in the photodiode 20 is outputted through the photodiode transistor. In this case, to generate a great amount of optical electric charges in the photodiode, it is required to obtain a high voltage applied to the photodiode through the photodiode transistor.

The voltage applied to the photodiode is a threshold voltage (Vdd–Vth) of the power voltage Vdd-photodiode transistor Vth.

That is, to make the high voltage of the photodiode, it is required to obtain the high power voltage Vdd, and to lower the threshold voltage. Furthermore, in order to lower the threshold voltage of the reset transistor or the transfer transistor, it is necessary to decrease the thickness of the gate insulating layer provided in each transistor.

However, in case of lowering the threshold voltage of the transistor, it may have the problem of reliability in the driving part transistor of the drive transistor and the select transistor. The driving part transistor is positioned between the Vdd and Vss terminals, whereby a great amount of positive electric charges flow in the driving part transistor as compared with that in the photodiode transistor. As a result, as the power voltage Vdd becomes high, the reliability of the driving part transistor is deteriorated.

The thickness of the gate insulating layer is correlated with the reliability of the driving part transistor, whereby the operation reliability of the CMOS image sensor is very sensitive to the thickness control of the gate insulating layer.

Accordingly, in the related art CMOS image sensor, the gate insulating layers corresponding to the photodiode transistor and the driving part transistor have the same thickness. To improve the output voltage of the photodiode, it is necessary to decrease the thickness of the gate insulating layer comprising the photodiode transistor, as well as to apply the high power voltage Vdd. In this case, if decreasing the thickness of the gate insulating layer, it has a bad influence to the reliability of the driving part transistor.

SUMMARY OF THE INVENTION

Accordingly, the present invention is directed to a CMOS image sensor and a method for fabricating the same that substantially obviates one or more problems due to limitations and disadvantages of the related art.

An object of the present invention is to provide a CMOS image sensor and a method for fabricating the same, to improve reliability of a driving part transistor and to improve an output voltage of a photodiode.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a CMOS image sensor includes a semiconductor substrate defined as a photodiode transistor region and a driving part transistor region; a first gate insulating layer on the photodiode transistor region of the semiconductor substrate; a second gate insulating layer on the driving part transistor region of the semiconductor substrate, wherein the second gate insulating layer is thicker than the first gate insulating layer; and gate electrodes on the respective first and second gate insulating layers.

In another aspect, a method for fabricating a CMOS image sensor includes the steps of preparing a semiconductor substrate defined as a photodiode transistor region and a driving part transistor region; forming a first gate insulating layer on the driving part transistor region of the semiconductor substrate; forming a second gate insulating layer of the photodiode transistor region and the driving part transistor region of the semiconductor substrate; and forming respective gate electrodes of a photodiode transistor and a driving part transistor by coating a conductive layer on the first and second gate insulating layers, and selectively removing the coated conductive layer and the first and second gate insulating layers.

When forming the photodiode transistor and driving part transistor of the 3T-type CMOS image sensor, the gate insulating layer corresponding the photodiode transistor has the different thickness from the gate insulating layer corresponding to the driving part transistor, thereby improving the output voltage of the photodiode, simultaneously, improving reliability of the driving part transistor.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, a CMOS image sensor and a method for fabricating the same will be described with reference to the accompanying drawings.

Figure 6:
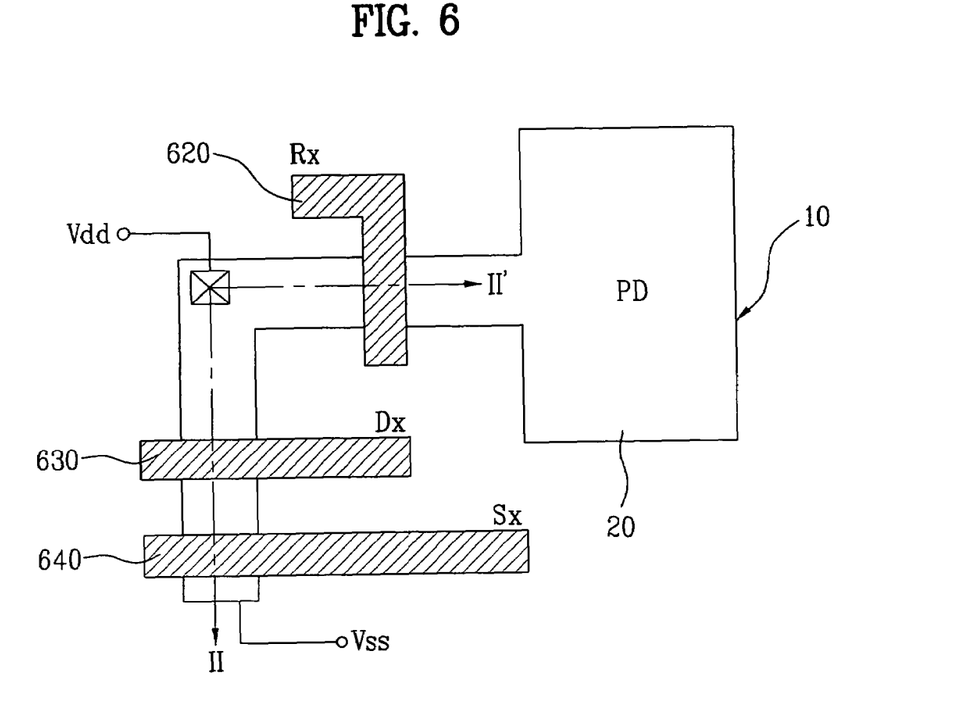
FIG. 6 is a layout of a CMOS image sensor according to the present invention.
Figure 7:
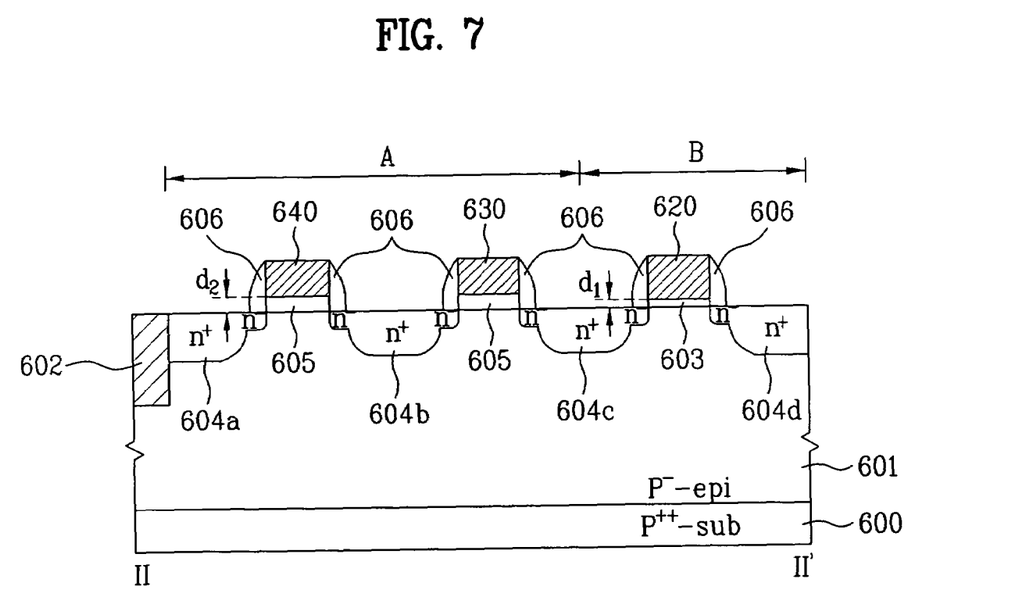
FIG. 7 is a cross sectional view of a CMOS image sensor along II–II' of FIG. 6 according to the present invention.

FIG. 6 is a layout of a CMOS image sensor according to the present invention. FIG. 7 is a cross sectional view of a CMOS image sensor along II–II' of FIG. 6 according to the present invention.

For reference, the present invention may be applicable to all kinds of CMOS image sensor as well as a 3T-type CMOS image sensor. Herein, a 3T-type CMOS image sensor will be described mainly.

First, in the CMOS image sensor according to the present invention, as shown in FIG. 6, an active area 10 is defined on a first conductive type semiconductor substrate. Then, one photodiode 20 is formed in a large sized portion of the active area 10, and respective gate electrodes 620, 630, and 640 of three transistors are overlapped with the remaining portion of the active area 10. That is, a reset transistor Rx is formed by the gate electrode 620, a drive transistor Dx is formed by the gate electrode 630, and a select transistor Sx is formed by the gate electrode 640. At this time, impurity ions are implanted to the active area 10 of the respective transistors except portions corresponding to the gate electrodes 620, 630, and 640, thereby forming source/drain regions in the respective transistors. Accordingly, a power voltage Vdd is applied to the source/drain regions between the reset transistor Rx and the drive transistor Dx, and a power voltage Vss is applied to the source/drain regions at one side of the select transistor Sx.

A cross sectional view of the respective transistors in the CMOS image sensor according to the present invention will be described as follows.

As shown in FIG. 7, a p-type epitaxial layer 601 is formed on the first conductive type semiconductor substrate 600. In this case, the p-type epitaxial layer 601 forms a large and deep depletion region in the photodiode, thereby improving efficiency of low-voltage photodiode for gathering optical electric charges, and improving photosensitivity.

By defining the active area, a device isolation film 602 is formed in a field area of the p-type epitaxial layer 601. Then, the gate electrode 620 of the reset transistor, the gate electrode 630 of the drive transistor, and the gate electrode 640 of the select transistor are formed in the active area of the p-type epitaxial layer 601. After that, insulating spacers 606 are formed at the right and left sidewalls of the respective gate electrodes 620, 630, and 640. Also, source/drain regions 604a, 604b, 604c, and 604d of an LDD structure are formed in the active area between the respective gate electrodes 620, 630, and 640.

Furthermore, gate insulating layers 603 and 605 are formed between the p-type epitaxial layer 601 and each gate electrode 620, 630, and 640, wherein the gate insulating layers 603 and 605 have the different thickness depending on the photodiode transistor and the driving part transistor. That is, the thickness $d_1$ of the gate insulating layer 603 formed below the gate electrode 620 of the reset transistor (corresponding to a reset transistor and a transfer transistor in case of 4T-type) is less than the thickness $d_2$ of the gate insulating layer 605 formed below the driving part transistor, that is, the gate electrodes 630 and 640 of the drive transistor and the select transistor. In this case, the gate insulating layers have the different thickness to improve the output voltage of the photodiode, simultaneously, to secure reliability of the driving part transistor.

To improve the output voltage of the photodiode, it is required to decrease the thickness of the gate insulating layer corresponding to the photodiode transistor, and to improve the Vdd voltage. However, if the decrease of the thickness is equally applied to the gate insulating layer of the driving part transistor as well as to the gate insulating layer of the photodiode transistor, there may have a load to the driving part transistor, to which the relatively high voltage is applied, thereby causing the problem of reliability.

To overcome this problem, in the CMOS image sensor according to the present invention, the gate insulating layer corresponding to the photodiode transistor has the different thickness from the gate insulating layer corresponding to the driving part transistor.

Meanwhile, it is preferable to form the gate insulating layer 603 provided below the gate electrode of the photodiode transistor at a thickness between 15 Å and 40 Å, and to form the gate insulating layer 605 provided below the gate electrode of the driving part transistor at a thickness 30 Å and 80 Å.

A method for fabricating the CMOS image sensor according to the present invention will be described as follows.

Figure 8A:
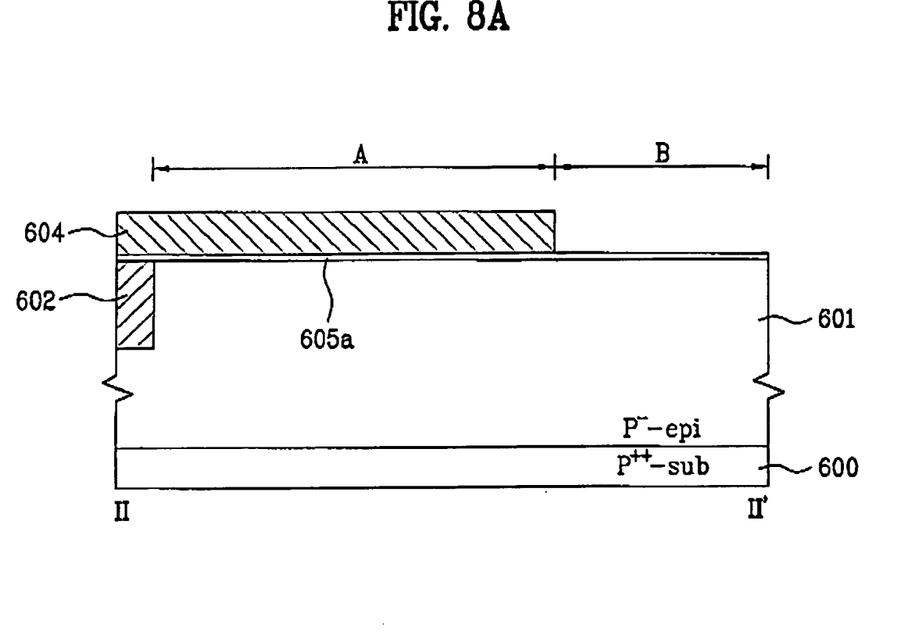
FIG. 8A to FIG. 8C are cross sectional views of a method for fabricating a CMOS image sensor along II—II' of FIG. 6 according to the present invention.
Figure 8B:
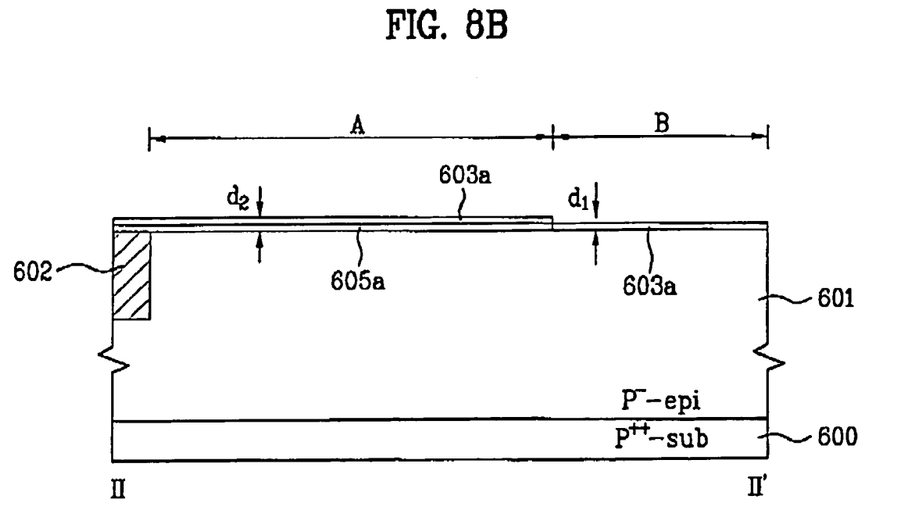
Figure 8C:
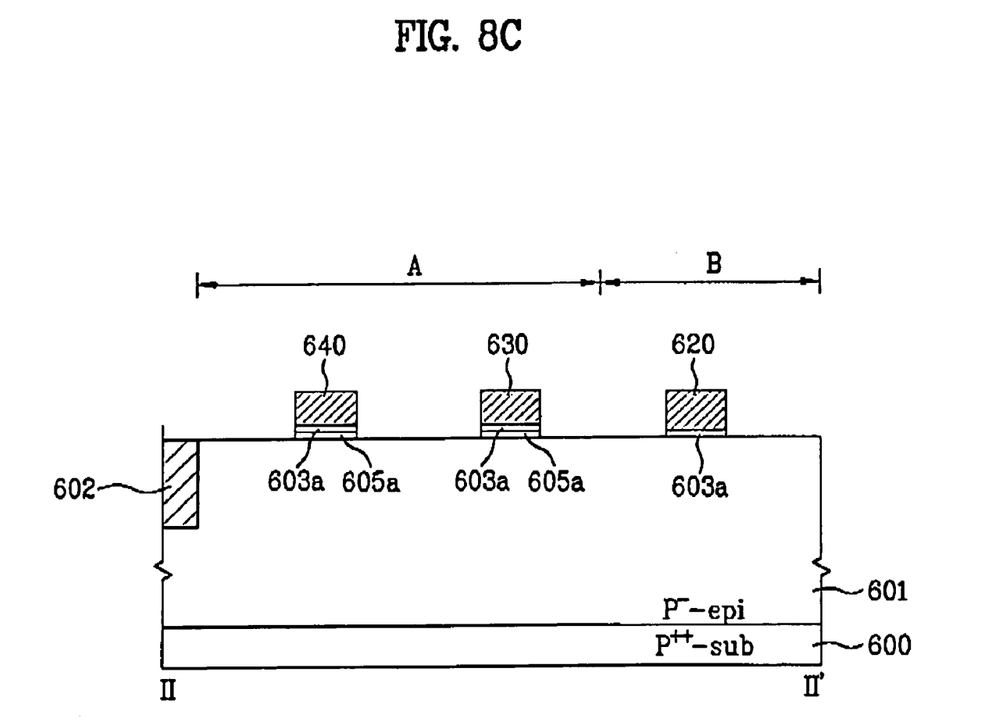

FIG. 8A to FIG. 8C are cross sectional views of a method for fabricating the CMOS image sensor along II–II' of FIG. 6 according to the present invention.

As shown in FIG. 8A, the p-type epitaxial layer 601 is formed on the p-type semiconductor substrate 600 (for example, p-type monocrystalline silicon substrate). Subsequently, the device isolation film 602 is formed in the field area of the p-type epitaxial layer 601 by STI (shallow trench isolation) or LOCOS (local oxidization of silicon), thereby defining the active area of the p-type epitaxial layer 601. The device isolation film 602 may be formed by PBL (poly buffer LOCOS) or R-LOCOS (recessed LOCOS).

In this state, a process for forming the gate insulating layer is progressed. The gate insulating layer may be formed by a thermal oxidation process. The process for forming the gate insulating layer is separately progressed to a photodiode transistor region B and a driving part transistor region A. For example, a first gate insulating layer 605a is formed at a thickness between 15 Å and 40 Å by the thermal oxidation process or low pressure CVD process. Then, a photosensitive layer is coated on an entire surface of the p-type epitaxial layer 601, and selectively patterned, thereby forming a photosensitive pattern 604 remaining on the portion corresponding to the driving part transistor region A. Subsequently, the first gate insulating layer 605a is etched to expose the p-type epitaxial layer 601 by using the photosensitive pattern 604 as a mask.

In this state, as shown in FIG. 8B, after removing the photosensitive pattern 604, a second gate insulating layer 603a is formed at a thickness between 15 Å and 40 Å on an entire area of the driving part transistor region A and the photodiode transistor region B by the thermal oxidation process. As a result, the gate insulating layer corresponding to the photodiode transistor region B has the different thickness from the gate insulating layer corresponding to the driving part transistor region A. That is, the photodiode transistor region B has a thickness corresponding to the second gate insulating layer 603a, and the driving part transistor region A has a thickness corresponding to a deposition layer of the first gate insulating layer 605a and the second gate insulating layer 603a.

After forming the gate insulating layer having the different thickness, a general CMOS image sensor fabrication process may be applied. That is, as shown in FIG. 8C, after depositing a conductive layer for the gate electrode on the first and second gate insulating layers 603a and 605a, the deposited conductive layer and the first and second gate insulating layers 603a and 605a formed therebelow are patterned selectively, thereby completing the gate electrode 620 of the reset transistor, the gate electrode 630 of the drive transistor, and the gate electrode 640 of the select transistor.

Although not shown, the fabrication process for the CMOS image sensor according to the present invention is completed by performing the process of lightly implanting n-type impurity ions for the LDD structure, and of forming the spacers at the right and left sidewalls of the gate electrode.

Meanwhile, the preferred embodiment of the present invention applied to the 3T-type CMOS image is explained. However, the present invention may be applicable to all kinds of CMOS image sensor as well as the 3T-type image sensor, by forming the gate insulating layer having the different thickness depending on the photodiode transistor and the driving part transistor.

As mentioned above, the CMOS image sensor according to the present invention and the method for fabricating the same have the following advantages.

When forming the photodiode transistor and driving part transistor of the 3T-type CMOS image sensor, the gate insulating layer corresponding the photodiode transistor has the different thickness from the gate insulating layer corresponding to the driving part transistor, thereby improving the output voltage of the photodiode, simultaneously, improving reliability of the driving part transistor.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method for fabricating a CMOS image sensor comprising:
   forming a first conductive-type epitaxial layer on a first conductive-type semiconductor substrate;
   preparing the semiconductor substrate to have a photodiode transistor region and a driving part transistor region defined thereon;
   forming a first gate insulating layer on the driving part transistor region;
   forming a second gate insulating layer on the first gate insulating layer and on the photodiode transistor region; and
   forming respective gate electrodes of a photodiode transistor and a driving part transistor by coating a conductive layer on the first and second gate insulating layers, and selectively removing the coated conductive layer and the first and second gate insulating layers.

2. The method of claim 1, wherein the photodiode transistor region forms a reset transistor therein, or a reset transistor and a transfer transistor therein.

3. The method of claim 1, wherein the driving part transistor region forms a drive transistor and a select transistor therein.

4. The method of claim 1, wherein the first gate insulating layer is formed at a thickness between 15Å and 40Å.

5. The method of claim 1, wherein the second gate insulating layer is formed at a thickness between 15Å and 40Å.

6. The method of claim 1, further comprising the process of forming source/drain regions by implanting impurity ions to the semiconductor substrate at both sides of the respective gate electrodes in the photodiode transistor region and the driving part transistor region.

* * * * *